United States Patent [19]

Masahiro et al.

[11] Patent Number: 5,592,122
[45] Date of Patent: Jan. 7, 1997

[54] RADIO-FREQUENCY POWER AMPLIFIER WITH INPUT IMPEDANCE MATCHING CIRCUIT BASED ON HARMONIC WAVE

[75] Inventors: Maeda Masahiro, Neyagawa; Osamu Ishikawa, Kyoto; Hiroyasu Takehara, Katano, all of Japan

[73] Assignee: Matsushita Electric Industrial Co., Ltd., Kadoma, Japan

[21] Appl. No.: 436,142

[22] Filed: May 8, 1995

[30] Foreign Application Priority Data

May 19, 1994 [JP] Japan .................................. 6-105430

[51] Int. Cl.⁶ ............................... H03F 3/60; H03F 3/191
[52] U.S. Cl. ........................ 330/286; 330/302; 330/305
[58] Field of Search .................................. 330/277, 286, 330/302, 305; 333/32, 33

[56] References Cited

U.S. PATENT DOCUMENTS

| | | | |
|---|---|---|---|
| 5,202,649 | 4/1993 | Kashiwa | 330/305 X |
| 5,347,229 | 9/1994 | Duckling et al. | 330/251 |
| 5,469,107 | 11/1995 | Kohno | 330/302 X |

FOREIGN PATENT DOCUMENTS

| | | |
|---|---|---|
| 0467270 | 1/1992 | European Pat. Off. . |
| 0547871 | 6/1993 | European Pat. Off. . |
| 58-159002 | 9/1983 | Japan . |
| 62-114310 | 5/1987 | Japan . |

OTHER PUBLICATIONS

Search Report for European Appl. 95107019.2, mailed Aug. 30, 1995.

Dooi et al, "A Low–Intermodulation, High Efficiency Harmonic . . . ," Electronics and Comm. in Japan, Part 1, 75 (1992) Oct., No. 10, NY pp. 89–101.

Takagi et al, "A UHF Band 1.3W Monolithic Amplifier with Efficncy of 63%" IEEE 1992, Microwave and Millimeter Symposium, pp. 35–38.

Bahl et al, "Class–B Power MMIC Amplifiers with 70% Power–Added Efficiency," IEEE Transactions on Microwave Theory and Techniques, 37 (1989) Sep. No. 9, N.Y., pp. 1315–1320.

Snider, IEEE Transactions on Electron Devices, vol. ED–14, No. 12, pp. 851–857, 1967, "A Theoretical Analysis and Experimental Confirmation of the Optimally Loaded and Overdriven RF Power Amplifier."

Nakayama et al, Technical Report of IEICE, ED93–170, NW 93–127, ICD93–185, pp. 17–22, 1994, "UHF Band Low–Voltage High–Efficiency FET Amplifier."

*Primary Examiner*—Steven Mottola
*Attorney, Agent, or Firm*—Renner, Otto, Boisselle, Sklar

[57] ABSTRACT

In an RF power amplifier, an input-side RF terminal is connected to a gate of an FET via an input-side matching line. A source of the FET is grounded. A drain of the FET is connected to an output-side RF terminal via an output-side matching line. To a line connected to the drain of the FET, a circuit for controlling an output impedance for the secondary harmonic wave is connected, including a first line and a first capacitor. To a line connected to the gate of the FET, a circuit for controlling an input impedance for the secondary harmonic wave is connected, including a second line and a second capacitor. The length of the second line is set so that an electric length thereof becomes longer than one-fourth of the wavelength for the fundamental wave frequency. Thus, an impedance for the harmonic wave is controlled at the input side of the power transistor.

13 Claims, 15 Drawing Sheets

RADIO-FREQUENCY POWER AMPLIFIER WITH INPUT IMPEDANCE MATCHING CIRCUIT BASED ON HARMONIC WAVE

BACKGROUND OF THE INVENTION

1. Field of the Invention

The present invention relates to a radio frequency (hereinafter, referred to as simply "RF") power amplifier for obtaining RF power using a semiconductor device, which is mainly used for a transmitting circuit section of a communication apparatus and the like utilizing a microwave band.

2. Description of the Related Art

Since various types of communication systems such as a portable telephone are widely used these days, there is an increasing demand for an RF power amplifier in a microwave band. With such a demand, the RF power amplifier is required to operate at a low voltage with high efficiency and to be miniaturized and lightened. Therefore, a GaAs device, which is: suitable for highly efficient low voltage operation as compared with a silicon device, is likely to be used in an RF power amplifier.

Concerning the circuit design of the RF power amplifier, the following has been reported. When an output circuit of a switching device such as a transistor included therein is designed in view not only of a frequency of a fundamental wave (hereinafter, referred to as the fundamental wave frequency) but also of harmonic wave components, the RF power amplifier operates with higher efficiency as compared with the case where the output circuit is designed in view of the fundamental wave frequency alone. For example, "A Theoretical Analysis and Experimental Confirmation of the Optimally Loaded and Overdriven RF Power Amplifier" written by David M. Snider, IEEE Trans. on Electron Devices, Vol. ED-14, No. 12, pp. 851–857 (December 1967), describes the realization of the optimum efficiency conditions that impedances are made 0 for harmonic wave components having a frequency obtained by multiplying the fundamental wave frequency by an even number in addition to obtaining the impedance matching at the fundamental wave frequency, at an output end of a transistor included in an RF power amplifier. Japanese Laid-Open Patent Publication Nos. 58-159002 and 62-114310 each discloses a specific circuit configuration for satisfying the above optimum efficiency conditions. Furthermore, "UHF Band Low-Voltage High-efficiency FET Amplifier" written by Nakayama et al., Technical Report of IEICE., ED93-170, MW93-127, ICD93-185 (1994-01) reports that a two-stage RF power amplifier using GaAsFET, as an example of a specific circuit configuration as described above, exhibits an output power of 31 dBm and an efficiency of 61.5% at a frequency of 935 MHz and a drain voltage of 3.3 V.

Hereinafter, a conventional power amplifier for radio frequency disclosed in Japanese Laid-Open Patent Publication No. 58-159002 will be described, referring to the drawings.

FIG. 1 is a circuit diagram of a conventional RF power amplifier 50. The RF power amplifier 50, formed on a substrate having a predetermined value of a relative dielectric constant $\epsilon_\gamma$, includes a power field-effect transistor (hereinafter referred to as "FET") 60, an input impedance matching circuit 70 connected to an input side of the FET 60 and an output impedance matching circuit 80 connected to an output side of the FET 60. The input impedance matching circuit 70 matches the impedance of an external circuit connected to an input-side RF terminal 5 to the internal impedance of the FET 60. Similarly, the output impedance matching circuit 80 matches the impedance of the external circuit connected to an output-side RF terminal 14 to the internal impedance of the FET 60.

In the input impedance matching circuit 70, a gate 9 of the FET 60 is connected to the input-side RF terminal 5 via an input-side PC blocking capacitor 6 and an input-side matching line 7. The input-side matching line 7 is connected to a gate bias voltage supplying terminal 1 via a resistance 3 and is grounded via an input-side matching capacitor 8.

On the other hand, in the output impedance matching circuit 80, a drain 11 of the FET 60 is connected to an output-side RF terminal 14 via an output-side DC blocking capacitor 13 and an output-side matching line 12. The output-side matching line 12 is connected to a drain bias voltage supplying terminal 2 via a choke coil 4, and is grounded via an output-side matching capacitor 15. Furthermore, a first line 16 and a first capacitor 17 are connected in series between a point A of the line connected to the drain 11 of the FET 60 and the ground level.

A source 10 of the FET 60 is directly grounded.

In the above-mentioned configuration, the input impedance matching circuit 70 is designed so as to achieve the matching of input impedance at the fundamental wave frequency by adjusting the length of the input-side matching line 7 and the capacitance of the input-side matching capacitor 8. Similarly, the output impedance matching circuit 80 is designed so as to achieve the matching of output impedance at the fundamental wave frequency by adjusting the length of the output-side matching line 12 and the capacitance of the output-side matching capacitor 15.

Hereinafter, an input impedance for the fundamental wave frequency f, viewed from the point B in FIG. 1, is referred to as Zin(f), and an output impedance for the fundamental wave frequency, viewed from the point A, is referred to as Zout(f).

A length La of the first line 16 connected to the point A is designed so that an electric length thereof is equal to one-fourth of a wavelength for the fundamental wave frequency f. As a result, the impedance becomes infinite for the fundamental wave when the first line 16 is viewed from the point A. On the other hand, the length La thus designed corresponds to half of a wavelength of the secondary harmonic wave which has a twice frequency 2f and a half wavelength to those of the fundamental wave. Therefore, the impedance becomes 0 for the secondary harmonic wave when the first line 16 is viewed from the point A.

In this way, a circuit 31 including the first line 16 and the first capacitor 17 can independently control the output impedance Zout(2f) for the secondary harmonic wave without affecting the output impedance Zout(f) for the fundamental wave. Therefore, the circuit 31 functions as the output impedance control circuit for the secondary harmonic wave. Hereinafter, the circuit 31 is referred to as a Zout(2f) control circuit 31.

In the RF power amplifier, when the FET 60 to be used is specified, the optimum values of the respective impedances Zin(f), Zout(f) and Zout(2f) required for maximizing the operational efficiency are generally obtained in a unique way.

As described above, a conventional RF power amplifier 50, in which only the output impedance Zout(2f) for the secondary harmonic wave is controlled using the Zout(2f) control circuit 31, exhibits a total efficiency of 61.5% under a low-voltage (3.3 V) operating condition in a two-stage structure using a GaAsFET. It is difficult to realize an amplifier with high efficiency under the condition where a drain voltage is low. Accordingly, the aforementioned total efficiency of 61.5% under 3.3 V operating condition is substantially the maximum value for a conventional RF amplifier using a GaAs FET. Thus, it is difficult to provide the amplifier with higher efficiency with the conventional configuration.

SUMMARY OF THE INVENTION

The radio-frequency power amplifier of this invention includes: a power transistor; an input impedance matching circuit connected to an input of the power transistor; and an output impedance matching circuit connected to an output of the power transistor, wherein the input impedance matching circuit includes an input impedance control circuit for setting an input impedance for a harmonic wave with respect to a fundamental wave frequency within a predetermined range, the input impedance control circuit being connected to the input of the power transistor.

In one embodiment, the input impedance control circuit has a resonance point for a harmonic wave of a lower frequency than an operational frequency band of the power transistor.

In another embodiment, the input impedance control circuit sets an input impedance for a secondary harmonic wave within a range enclosed by a point A (0+j4Ω), a point B (0+j25Ω), a point C (5+j25Ω) and a point D (5+j4Ω) on a Smith chart.

In still another embodiment, the input impedance control circuit includes: a line having an electric length longer than one-fourth of a wavelength for the fundamental wave frequency; and a capacitor having one end connected to the line in series and another end grounded.

In still another embodiment, the input impedance control circuit includes a line having an electric length longer than one-eighth of a wavelength for the fundamental wave frequency, the line having an open end.

In still another embodiment, the input impedance control circuit includes a series resonance circuit, the series resonance circuit including a line and a capacitor, the capacitor having one end connected to the line in series and another end grounded.

In still another embodiment, the output impedance matching circuit includes an output impedance control circuit for setting an output impedance for the harmonic wave to a predetermined value, the output impedance control circuit being connected to the output of the power transistor.

In still another embodiment, the output impedance matching circuit is configured so that an output impedance for a secondary harmonic wave is set to a value with which a maximum operational efficiency of the power transistor is yielded.

According to another aspect of the invention, the radio-frequency power amplifier includes: a power transistor; an input impedance matching circuit connected to an input of the power transistor; and an output impedance matching circuit connected to an output of the power transistor, wherein the input impedance matching circuit sets an input impedance for a harmonic wave with respect to a fundamental wave frequency within a predetermined range.

In one embodiment, the input impedance matching circuit sets an input impedance for a secondary harmonic wave within a range enclosed by a point A (0+j4Ω), a point B (0+j25Ω), a point C (5+j25Ω) and a point D (5+j4Ω) on a Smith chart.

In another embodiment, the input impedance matching circuit includes: a matching line connected to the input of the power transistor; a first matching capacitor having one end connected to a first predetermined position of the matching line and another end grounded; and a second matching capacitor having one end connected to a second predetermined position of the matching line and another end grounded, and wherein a capacitance value of the first matching capacitor, a capacitance value of the second matching capacitor, and the first and the second predetermined positions are respectively selected so that an input impedance for a secondary harmonic wave is set within a predetermined range.

In still another embodiment, the output impedance matching circuit includes an output impedance control circuit which is connected to the output of the power transistor and sets an output impedance for the harmonic wave to a predetermined value.

In still another embodiment, the output impedance matching circuit is configured so that an output impedance for a secondary harmonic wave is set to a value with which a maximum operational efficiency of the power transistor is yielded.

Thus, the invention described herein makes possible the advantage of providing an RF power amplifier with higher efficiency.

This and other advantages of the present invention will become apparent to those skilled in the art upon reading and understanding the following detailed description with reference to the accompanying figures.

DESCRIPTION OF THE PREFERRED EMBODIMENTS

Figure 1:
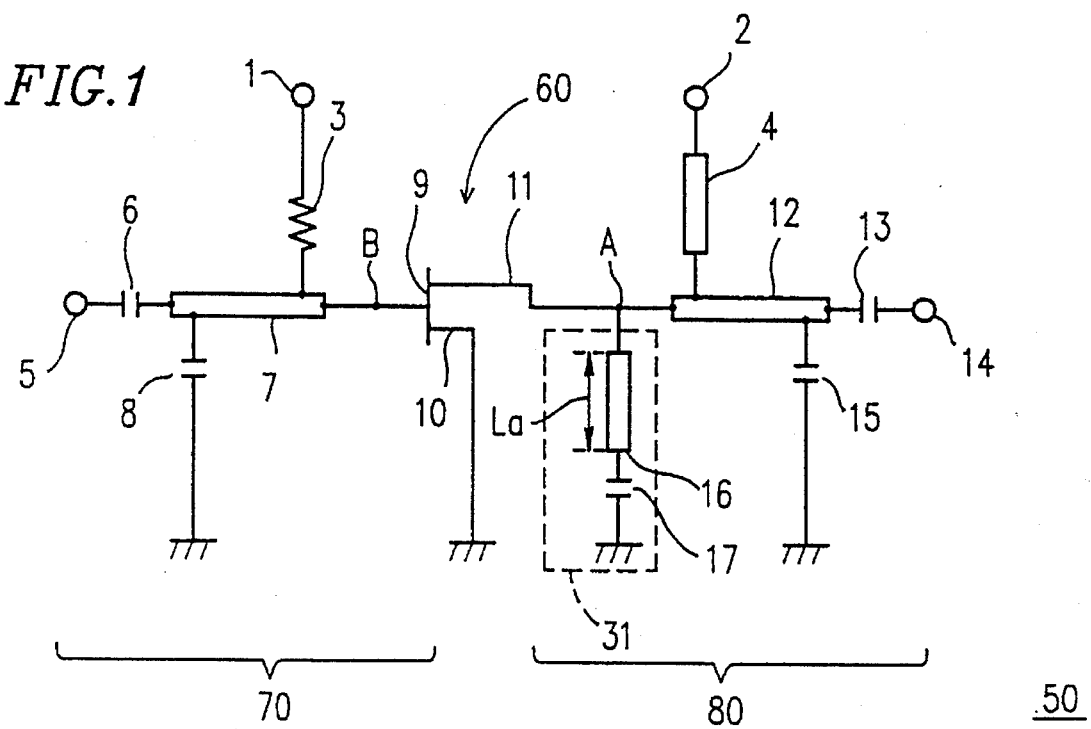
FIG. 1 is a circuit diagram showing an exemplary configuration of a conventional RF power amplifier.

Hereinafter, examples of RF power amplifiers of the present invention will be described with reference to the drawings. In the following description components equivalent to those in the drawings previously described are denoted by the same reference numerals.

(Example 1)

Figure 2:
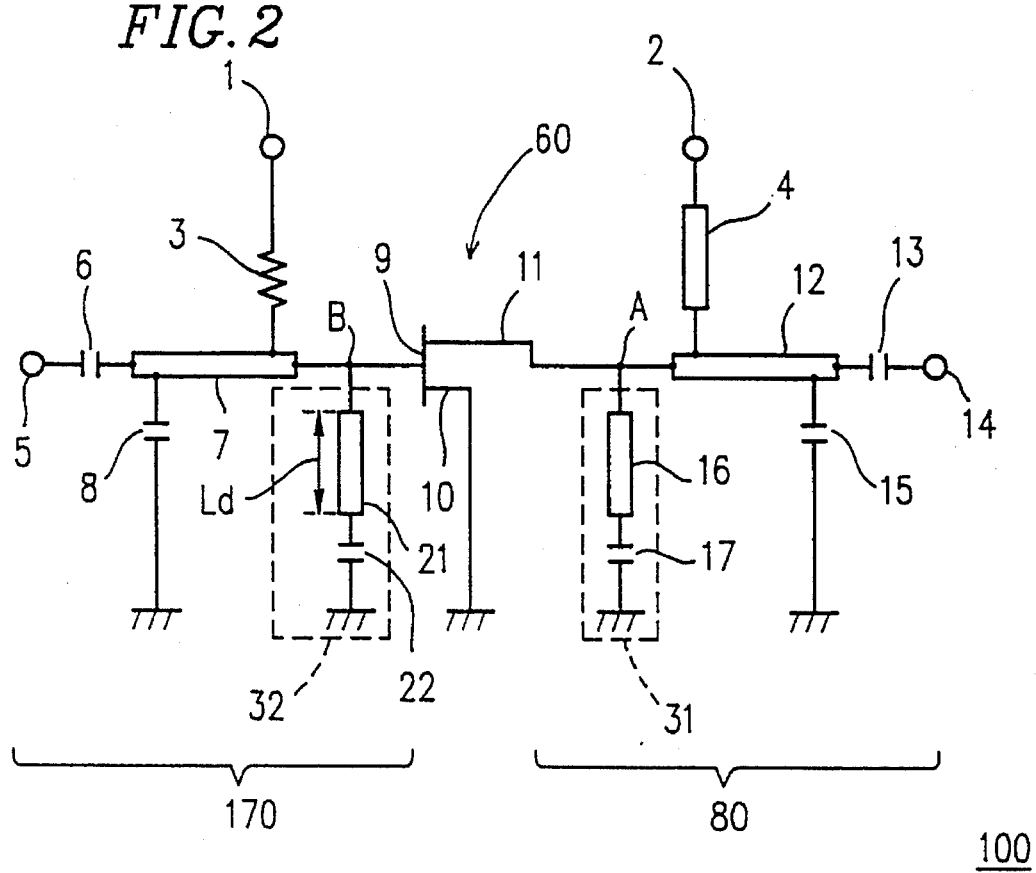
FIG. 2 is a circuit diagram showing the configuration of an RF power amplifier according to Example 1 of the present invention.

FIG. 2 is a circuit diagram showing an RF power amplifier 100 according to Example 1 of the present invention.

The RF power amplifier 100, formed on a substrate having a predetermined value of a relative dielectric constant $\epsilon\gamma$, includes the FET 60, an input impedance matching circuit 170 connected to the input side of the FET 60, and the output impedance matching circuit 80 connected to the output side of the FET 60. The RF power amplifier 100 differs from the conventional RF power amplifier described with reference to FIG. 1 with respect to the configuration of the input impedance matching circuit 170.

Specifically, a second line 21 having a length Ld and a second capacitor 22 grounding the second line 21 are connected in series to the point B of the line connected to the gate 9 of the FET 60. When the length Ld of the second line 21 is designed so that an electric length thereof corresponds to about one-fourth of the wavelength for the fundamental wave frequency, the impedance becomes infinite for the fundamental wave when the second line 21 is viewed from the point B. On the other hand, the length Ld thus designed corresponds to half of a wavelength of the secondary harmonic wave which has a wavelength half that of the fundamental wave. Therefore, the impedance becomes substantially 0 for the secondary harmonic wave when the second line 21 is viewed from the point B.

Thus, the circuit 32 including the second line 21 and the second capacitor 22 can independently control the input impedance Zin(2f) for the secondary harmonic wave without affecting the input impedance Zin(f) for the fundamental wave. Therefore, the circuit 32 functions as an input impedance control circuit for the secondary harmonic wave. Hereinafter, the circuit 32 is referred to as a Zin(2f) control circuit 32.

As the FET 60 used for the RF power amplifier 100, for example, a GaAs MESFET can be used. Such a GaAs MESFET can be formed by, for example, the following method. After silicon ions are implanted into a semi-insulating GaAs substrate, the semi-insulating GaAs substrate is subjected to annealing in order to form a channel. Then, a recess is formed in the channel, thereby completing the GaAs MESFET. Typically, parameters of the FET 60 are a total gate width (Wg) of 12 mm, a saturated current (Idss) of 2.5 A, a gate-to-source breakdown voltage of 10 V or more, and a gate-to-drain breakdown voltage of 20 V or more.

The optimum values of the respective impedances Zin(f), Zout(f) and Zout(2f) required for maximizing the operational efficiency of the FET 60 at the fundamental wave frequency can be uniquely obtained. For example, when the length Ld of the second line 21 is adjusted to 30 mm, at which an electric length thereof substantially corresponds to about one-fourth of a wavelength for a frequency of 950 MHz on a substrate with a relative dielectric constant $\epsilon\gamma$ of 10, the optimum values of the respective impedances are as follows: Zin(f)=4+j12$\Omega$; Zout(f)=6+j1$\Omega$; and Zout(2f)=0.5+j13$\Omega$. In the Smith chart shown in FIG. 3, these optimum values are respectively plotted.

Figure 4:
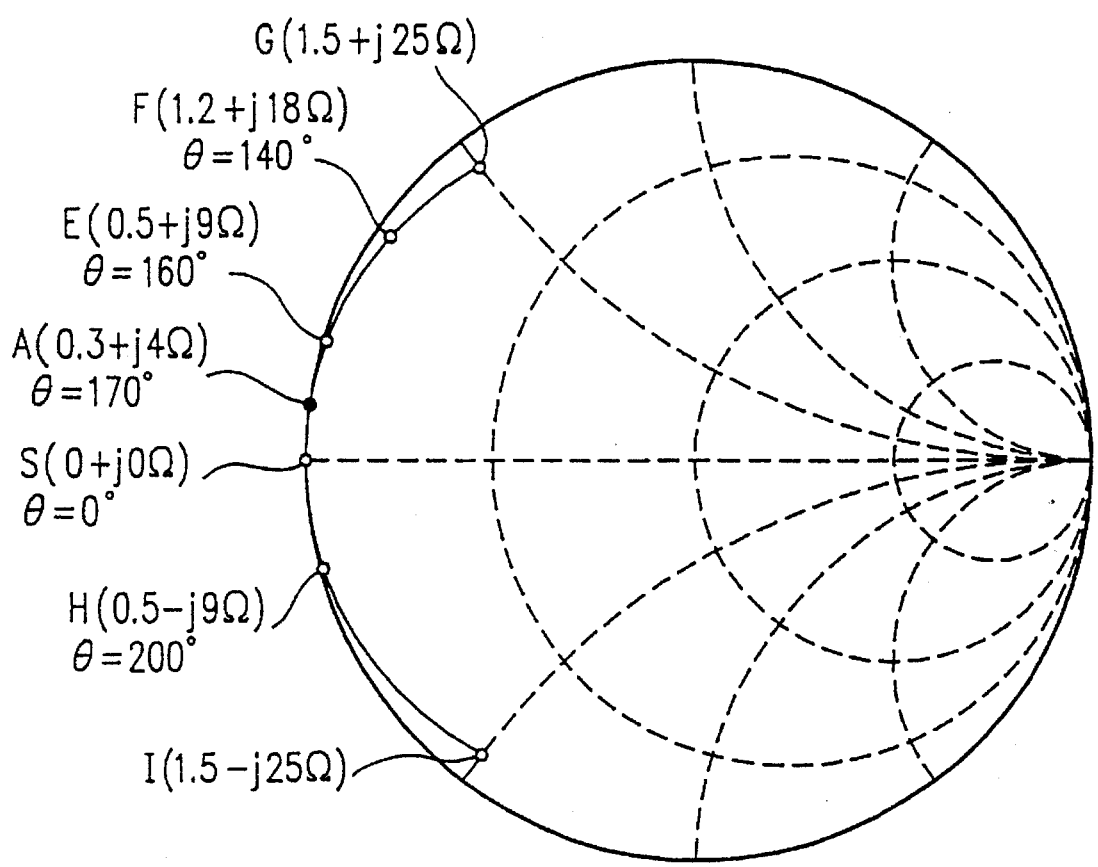
FIG. 4 is a Smith chart showing the change in Zin(2f) while varying a length Ld of a second line included in the RF power amplifier of FIG. 2.

Next, in order to examine the region of the input impedance Zin(2f) for the secondary harmonic wave where good drain efficiency can be obtained, the change in output characteristics of the RF power amplifier 100 accompanied by the change in the length Ld of the second line 21 is examined. Specifically, the change in the input impedance Zin(2f) for the secondary harmonic wave is measured while varying the length Ld of the second line 21 within the range of 28 mm to 35 mm on a substrate with a relative dielectric constant $\epsilon\gamma$ of 10. FIG. 4 is a Smith chart showing the measured result thereof.

As shown in FIG. 4, the input impedance Zin(2f) changes from the point G (1.5+j25$\Omega$) to the point I (1.5−j25$\Omega$) regarding the short-circuit point S on the Smith chart as the center. In this way, by changing the length Ld of the second line 21, the input impedance Zin(2f) can be changed so as to draw an arc on the Smith chart with the short-circuit point S (=0+j0$\Omega$) as the center, without substantially changing the input impedance Zin(f) for the fundamental wave.

Figure 5:
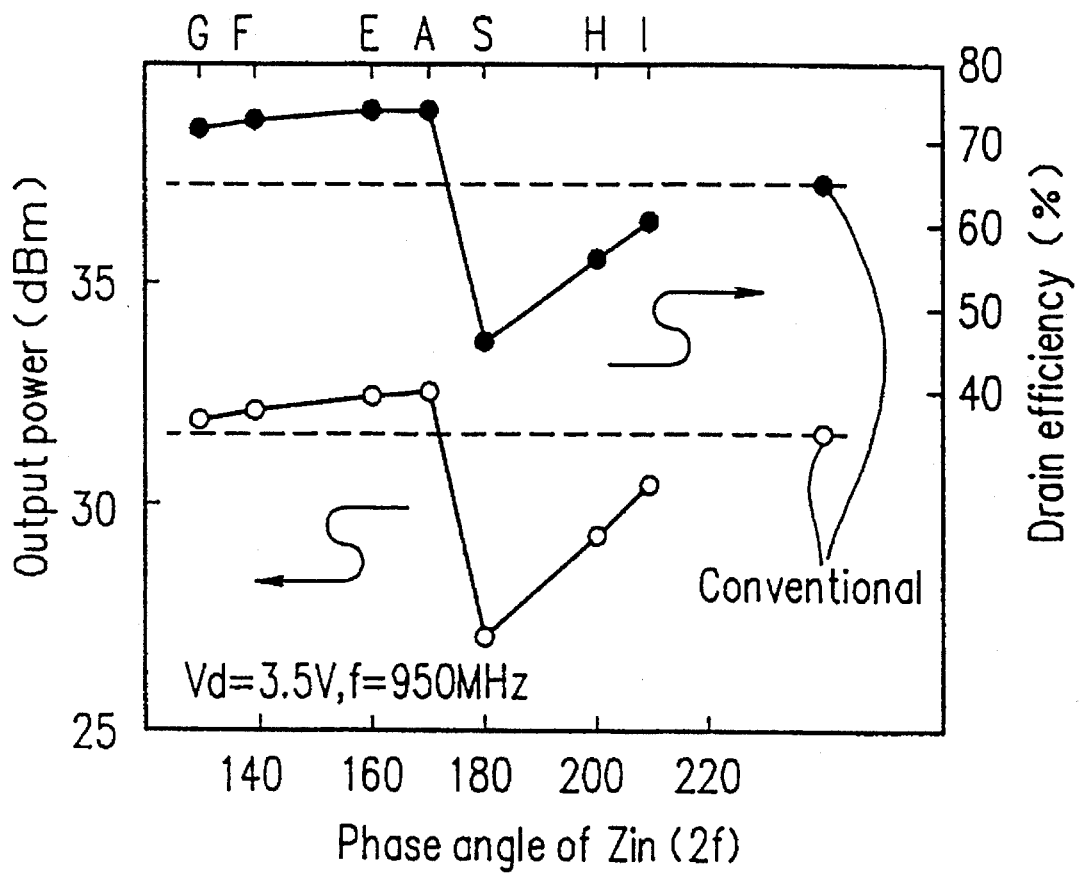
FIG. 5 is a graph showing output characteristics of the RF power amplifier of FIG. 2 while varying the length Ld of the second line included therein.

FIG. 5 shows the relationship between a phase angle of the input impedance Zin(2f) for the secondary harmonic wave and the output characteristics (drain efficiency and output power) of the RF power amplifier 100. In the same manner as that described above, the input impedance Zin(2f) for the secondary harmonic wave, which is viewed from the point B, is changed as shown in FIG. 4 while varying the length Ld of the second line 21 from 28 mm to 35 mm. The measurement is carried out under the conditions where a fundamental wave frequency is 950 MHz; a drain voltage is 3.5 V; and an input power is 20 dBm.

By this measurement, significantly preferable characteristics such as an output power of 32.5 dBm and a drain efficiency of 75% are obtained, when a phase angle of the input impedance Zin(2f) for the secondary harmonic wave is 160°, i.e., Zin(2f)=0.5+j9$\Omega$. The obtained characteristics are improved by 10% in terms of the drain efficiency as compared with those in the conventional technique. Furthermore, when the phase angle of the input impedance Zin(2f) for the secondary harmonic wave is within the range of 130° to 170°, that is, Zin(2f)=0+j4$\Omega$ (point A) to 1.5+j25$\Omega$ (point G), the RF power amplifier 100 exhibits good drain efficiency of 70% or more.

However, at the point H (0.5−j9$\Omega$) or the point I (1.5−j25$\Omega$) where the input impedance Zin(2f) for the secondary harmonic wave is within the capacitive region, the output characteristics become poorer than that of the measured result of the conventional technique. Furthermore, at the short-circuit joint S at which the input impedance Zin(2f) becomes 0 (0+j0$\Omega$), the output characteristics remarkably deteriorate.

Figure 6:
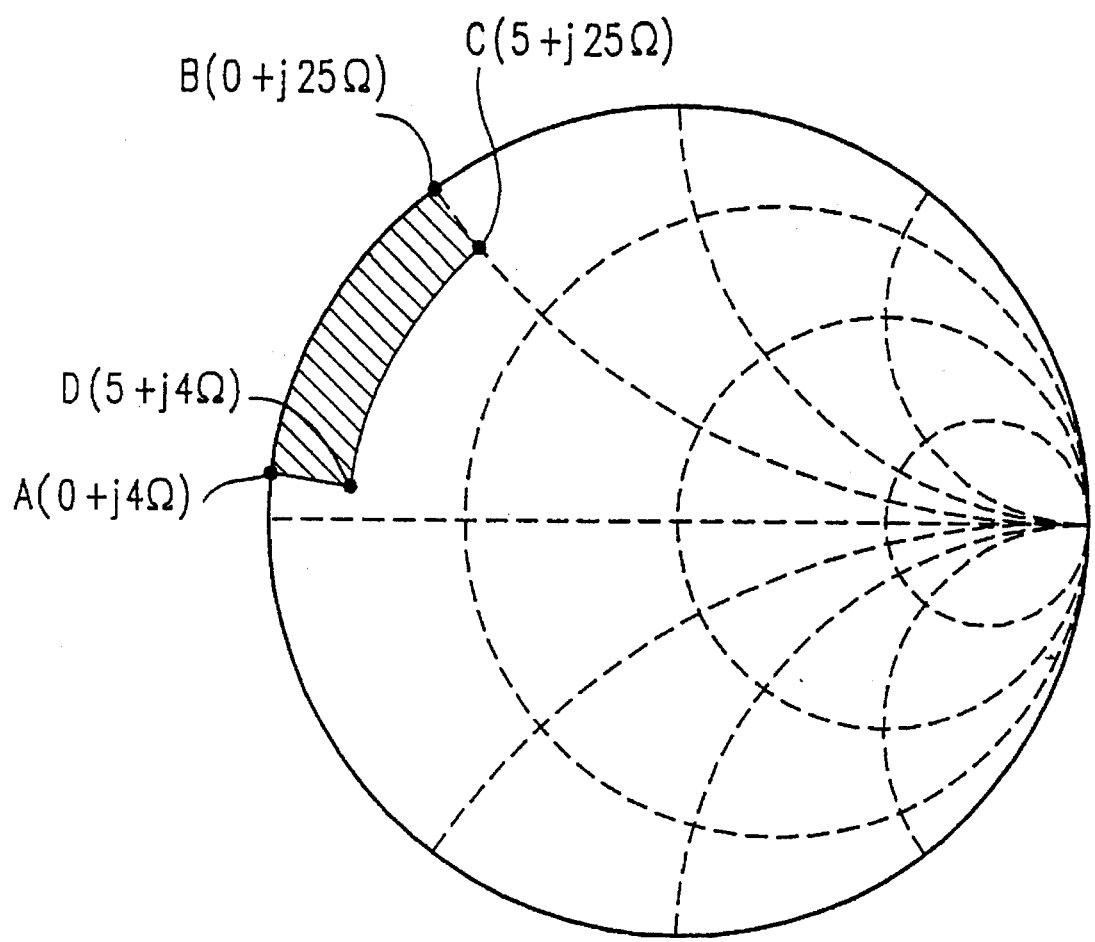
FIG. 6 is a Smith chart showing a preferred range of Zin(2f) in the RF power amplifier according to the present invention.

As the result of further detailed examination, when the input impedance Zin(2f) is set so as to be included in the hatched region enclosed by the point A (0+j4$\Omega$), the point B (0+j25$\Omega$), the point C (5+j25$\Omega$) and the point D (5+j4$\Omega$) in the Smith chart of FIG. 6, the RF power amplifier 100 exhibits a good operational characteristic, i.e., a drain efficiency of 65% or more, which is superior to that of the conventional technique, under the conditions where a fundamental wave frequency is 950 MHz; a drain voltage is 3.5 V; and an input power is 20 dBm. The above range indicates that the input impedance Zin(2f) for the secondary harmonic wave is within an inductive region.

For obtaining the matching of output impedance in the conventional technique, the output impedance Zout(2f) for the secondary harmonic wave is usually set to be 0 (=0+j0) so as to obtain the short-circuit conditions for the secondary harmonic wave.

EP-A-547871 which corresponds to U.S. Pat. No. 5,347,229 discloses a power amplifier using a heterojunction bipolar transistor (HBT) and having resonance circuits for harmonic waves at both input and output sides. The above reference reports that the higher operational efficiency can be realized when the impedance of an input circuit for the secondary harmonic wave becomes 0 (phase angle: +/−180°) and the impedance for the ternary harmonic wave is open (phase angle: 0°) at the reference plane of the device.

The reference describes that the terminal conditions of the ternary harmonic wave in the input circuit do not significantly affect the operational characteristics of the power amplifier.

In other words, the above reference, which discloses the installation of an impedance matching circuit on the input side, describes that the higher operational efficiency of the RF power amplifier can be accomplished in the case where the input impedance Zin(2f) for the secondary harmonic wave becomes zero (0+j0) to obtain the short-circuit conditions.

In light of the above, it is common knowledge in the conventional technique that the input impedance Zin(2f) and the output impedance Zout(2f) for the secondary harmonic wave are requires to be made zero in order to provide the RF power amplifier with higher operational efficiency.

As described above, however, the detailed examination of the inventors has revealed the following. When the short-circuit conditions of the input impedance Zin(2f) for the secondary harmonic wave are accomplished, that is, at Zin(2f) =0+j0Ω where a phase angle thereof is 180°, the output power and the operational efficiency are remarkably deteriorated, resulting in adversely affecting the operational characteristics. In other words, in the case where the input impedance Zin(2f) for the secondary harmonic wave becomes zero at the fundamental wave frequency which is a central frequency of the operational frequency band of the FET 60 (i.e., Zin(2f)=0+j0Ω), the operational characteristics are remarkably deteriorated at lower frequencies than the central frequency.

Therefore, in order to obtain good operational characteristics in the whole operational frequency band, the input impedance Zin(2f) for the secondary harmonic wave is required to be previously set within an inductive region so that the input impedance Zin(2f) does not become zero even for the lowest frequency applied to the RF power amplifier. This is realized by setting a resonance frequency of the Zin(2f) control circuit (input impedance control circuit) 32 connected to the input side of the FET 60 to a lower value than an operational frequency.

For comparison, the operational characteristics are evaluated with respect to the structure in which the Zin(2f) control circuit 32 is removed from the RF power amplifier 100 of Example 1 shown in FIG. 2 at Zin(2f)=0.5+j9Ω providing the aforementioned optimum operational performance (the output power of 32.5 dBm and the operational efficiency of 75%).

The input impedance Zin(f) for the fundamental wave does not change even if the Zin(2f) control circuit 32 is removed. However, the input impedance Zin(2f) for the secondary harmonic wave changes to: Zin(2f)=45−j100Ω. In such a case, the RF power amplifier exhibits an output power of 31.5 dBm and a drain efficiency of 65% under the conditions where a fundamental wave frequency is 950 MHz; a drain voltage is 3.5 V; and an input power is 20 dBm (shown in FIG. 5 as "conventional").

As described above, the RF power amplifier 100 of Example 1 having the Zin(2f) control circuit 32 exhibits an output power of 32.5 dBm and a drain efficiency of 75% under the same conditions. This result confirms that setting the input impedance Zin(2f) for the secondary harmonic wave to a predetermined impedance using the Zin(2f) control circuit 32 as in Example 1 greatly contributes to the improvement of the operational characteristics.

Figure 7:
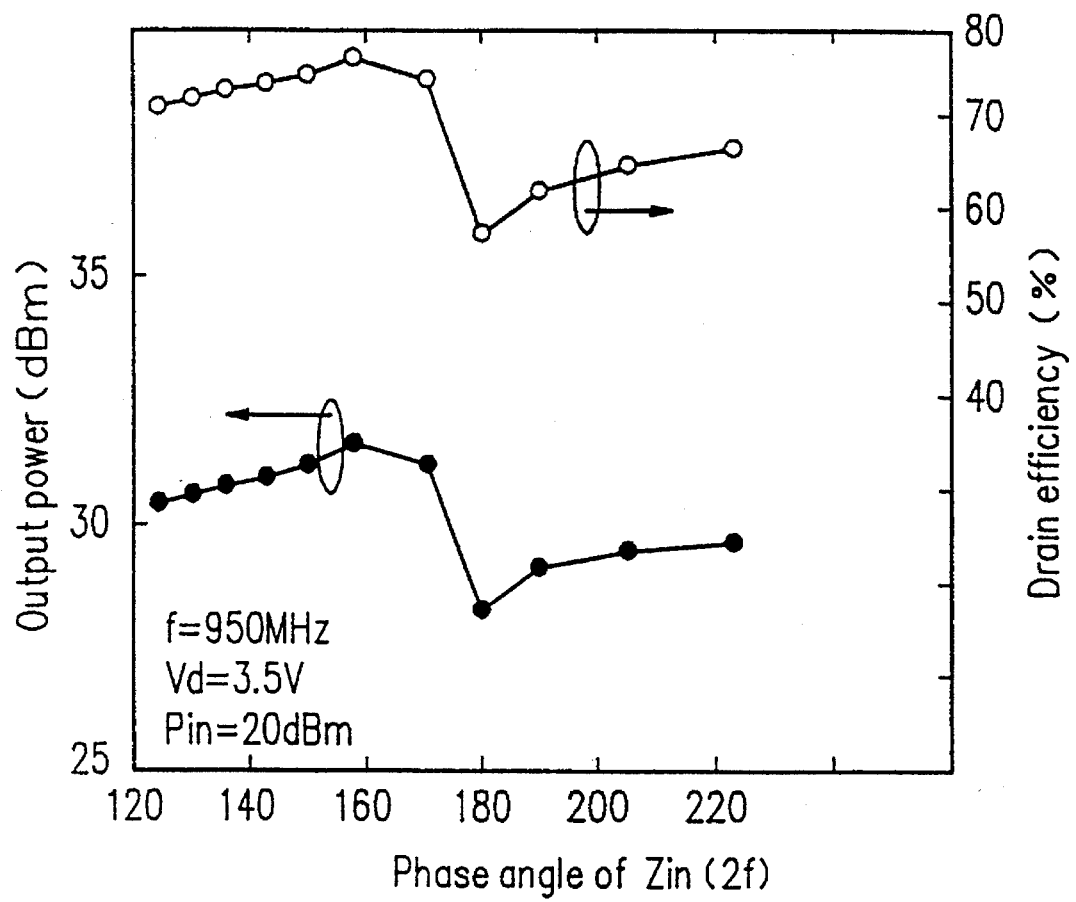
FIG. 7 is a graph showing the simulation results concerning the relationship between a phase angle of Zin(2f) and output characteristics of the RF power amplifier.

FIG. 7 is the analysis result showing the relationship between the phase angle of the input impedance Zin(2f) for the secondary harmonic wave and the output characteristics (the drain efficiency and the output power) by a high frequency simulator. The input impedance Zin(2f) for the secondary harmonic wave is changed so as to draw an arc along the external periphery of the Smith chart as shown in FIG. 4 where a drain voltage Vd is set to be 3.5 V and a fundamental wave frequency f is 950 MHz. The input and output impedances Zin(f) and Zout(f) for the fundamental wave and the output impedance Zout(2f) for the secondary harmonic wave are set to be constant values shown in FIG. 3, respectively.

As shown in FIG. 7, the result agreeing with the above-mentioned measured result is confirmed. More specifically, when the phase angle of the input impedance Zin(2f) for the secondary harmonic wave is 160°, preferable characteristics such as the output power (Pout) of 31.5 dBm and the drain efficiency of 76% are obtained. On the other hand, when the input impedance Zin(2f) for the secondary harmonic wave is zero and the phase angle is 180°, that is, the short-circuit condition of the input impedance Zin(2f) for the secondary harmonic wave is attained, the output power and the drain efficiency are deteriorated altogether, resulting in remarkable deterioration of the operational characteristics.

Hereinafter, the results of examination of the inventors will be described in regard to the mechanism for providing a higher operational efficiency of the RF power amplifier and the reason why the operational characteristics thereof are deteriorated under the conditions that the input impedance Zin(2f) becomes 0 for the secondary harmonic wave, respectively.

The mechanism for providing the higher operational efficiency is described with reference to voltage and current waveforms at the gate ends shown in FIGS. 8A and 8B.

Figure 8A:
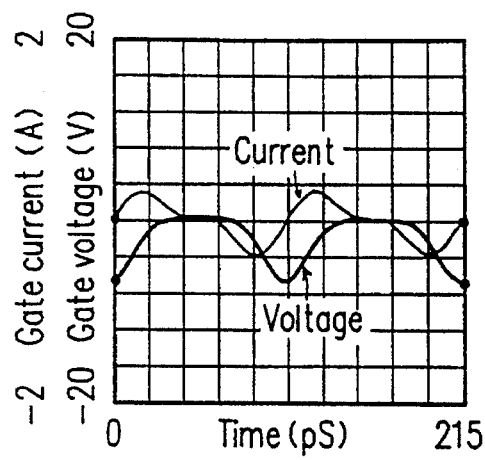
FIGS. 8A, 8B and 8C are graphs showing voltage and current waveforms at a gate terminal of an FET included in the RF power amplifier according to the present invention.
Figure 8B:
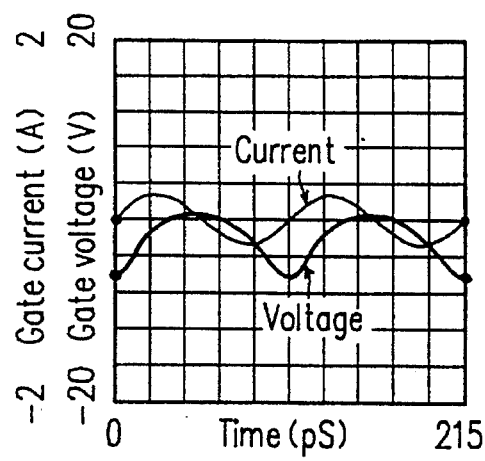

FIG. 8A shows voltage and current waveforms in the case where the input impedance Zin(2f) for the secondary harmonic wave is controlled in an optimum manner, and FIG. 8B shows voltage and current waveforms in the case where the input impedance Zin(2f) for the secondary harmonic wave is not controlled at all. More specifically, FIG. 8A shows the case of Zin(2f)=0.5+j9Ω, and FIG. 8B shows the case of Zin(2f)=45−j100Ω. In either case, the input power is constant at 20 dBm.

The voltage waveform at the gate end, which is a sinusoidal waveform in the case where the input impedance Zin(2f) for the secondary harmonic wave is not controlled (FIG. 8B), approaches a trapezoidal wave as shown in FIG. 8A owing to appropriate control of the input impedance Zin(2f) for the secondary harmonic wave. Making the gate voltage waveform approach the trapezoidal waveform promotes the switching of voltage/current at the drain end.

Thus, a time period in which a current and a voltage simultaneously occur at the drain end is shortened. As a result, the power to be consumed in the FET as heat is reduced, whereby the conversion efficiency into RF power is improved.

Then, the reason for deterioration of the operational characteristics will be described with reference to FIG. 8C.

Figure 8C:
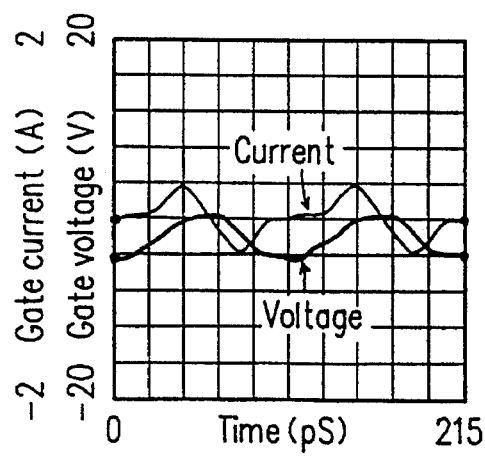

FIG. 8C shows voltage and current waveforms at the gate end in the case where the input impedance Zin(2f) for the secondary harmonic wave becomes 0. In this case, although the input power is constant, the voltage and current waveforms are disturbed. In addition, the amplitude of the voltage diminishes. Such a low gate voltage is insufficient to drive the FET included in the RF power amplifier. As a result, under the condition where the input impedance Zin(2f) for the secondary harmonic wave becomes zero, the output voltage and the efficiency are significantly deteriorated.

Table 1 shows the operational characteristics of some RF power amplifiers α, β and γ configured in accordance with the present example of the invention. In the RF power amplifiers α, β and γ, the input impedance Zin(2f) for the secondary harmonic wave is set to be a value or within the range shown in Table 1 with the Zin(2f) control circuit.

For comparison, Table 1 also shows the measured results of the operational characteristics of the RF power amplifier ε, in which the input impedance Zin(2f) for the secondary harmonic wave is set to 0+j0Ω, and a conventional RF power amplifier, in which the input impedance Zin(2f) for the secondary harmonic wave is not controlled.

Figure 3:
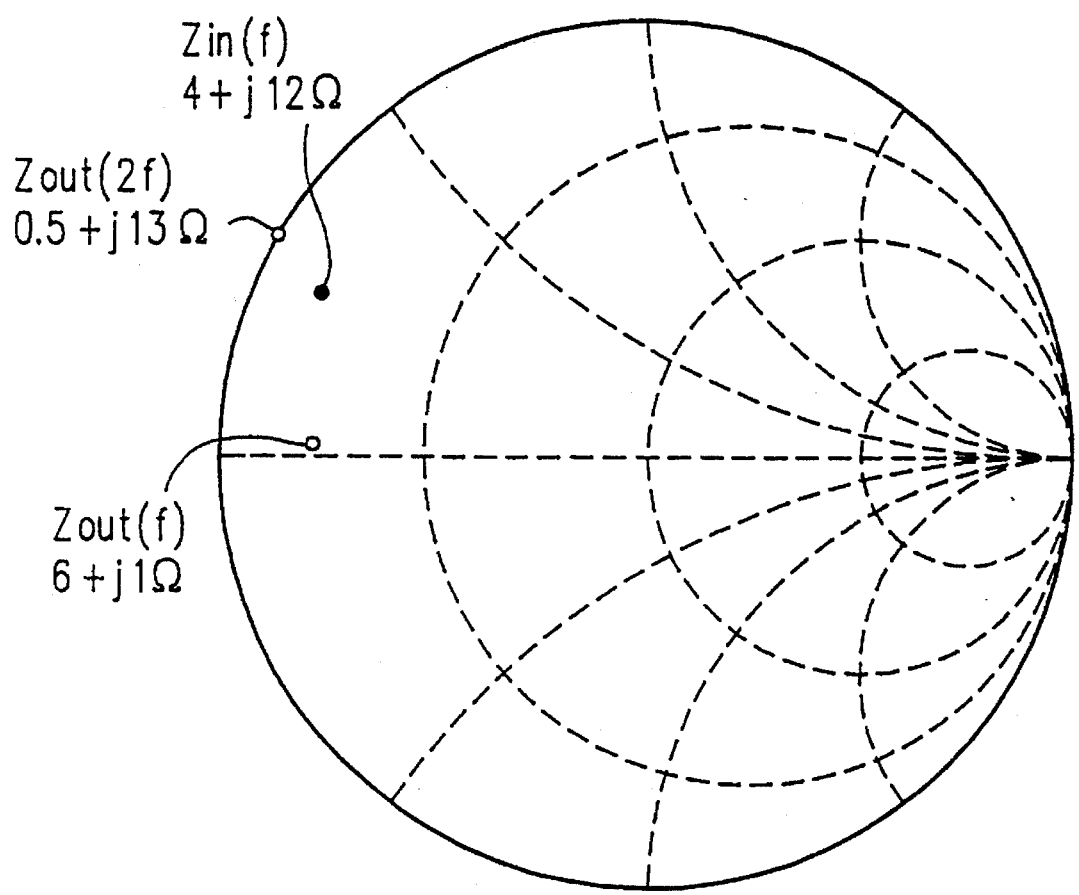
FIG. 3 is a Smith chart showing respective optimum values of Zin(f), Zout(f) and Zout(2f) of the RF power amplifier of FIG. 2.

Either RF power amplifier is designed so that the input and output impedances for the fundamental wave and the output impedance for the secondary harmonic wave respectively become the optimum values shown in FIG. 3, that is, Zin(f)=4+j12Ω, Zout(f)=6+j1Ω, and Zout(2f)=0.5+j13Ω. The operational characteristics are measured under the conditions where a fundamental wave frequency is 950 MHz; a drain voltage is 3.5 V; and an input power is 20 dBm. A substrate having a relative dielectric constant εγ of 10 is used.

As is apparent from Table 1, in the RF power amplifiers α, β and γ which are configured according to Example 1 to control the input impedance Zin(2f) for the secondary harmonic wave, the operational characteristics are improved as compared with those of the conventional example in which no control is performed.

TABLE 1

| Example of amplifier | Zin (2f) control | Value of Zin (2f) | Output power (dBm) | Drain efficiency (%) |
|---|---|---|---|---|
| Amplifier α | performed | 0.5 + j9Ω | 32.5 | 75 |
| Amplifier β | performed | *region S | 32 or more | 70 or more |
| Amplifier γ | performed | *region T | 31.5 or more | 65 or more |
| Amplifier ε | performed | 0 Ω | 27 | 45 |
| Conventional amplifier | not performed | 45-j100Ω | 31.5 | 65 |

*region S: the extent from the point A (0 + j4Ω) to the point G (1.5 + j25Ω), as shown in FIG. 4
*region T: the hatched region enclosed by the point A (0 + J4Ω), the point B (0 + J25Ω), the point C (5 + J25Ω) and the point D (5 +j4Ω), as shown in FIG. 6.

As described above, in the RF power amplifier 100 of Example 1, the Zin(2f) control circuit 32 is added to the point B of the line connected to the gate 10 of the FET 60 to set the input impedance Zin(2f) for the secondary harmonic wave within a predetermined range. With this process, the operational efficiency of the RF power amplifier 100 is improved by 10% at maximum in terms of the drain efficiency, as compared with the conventional technique. Therefore, the drain efficiency of 75% is obtained.

However, the output power and the efficiency are remarkably deteriorated under the conditions where the input impedance Zin(2f) for the secondary harmonic wave becomes zero (phase angle: 180°), resulting in inferior characteristics to those of a conventional method. Therefore, it is important to design the Zin(2f) control circuit (input impedance control circuit) 32 included in the input impedance matching circuit 70 so that the input impedance Zin(2f) for the secondary harmonic wave does not become zero at the operational frequency.

In order to obtain an appropriate value of the input impedance Zin(2f) for the secondary harmonic wave, the length Ld of the second line 21 and/or the capacitance of the second capacitor 22 included in the Zin(2f) control circuit 32 is appropriately set. Specifically, the length Ld of The second line 21 is set so that an electric length thereof becomes longer than one-fourth of a wavelength for the fundamental wave frequency. In addition, the capacitance of the second capacitor 22 is set so that the input impedance Zin(2f) for the secondary harmonic wave is included in the hatched region shown in FIG. 6 based on the thus set length Ld of the second line 21.

For example, in the case where the fundamental wave frequency f is 950 MHz and a substrate having a relative dielectric constant εγ of 10 is used, the length Ld of the second line 21 is set to be in the range from 30.5 mm to 35 mm, which are longer than 30 mm at which an electric length thereof is equal to one-fourth of the wavelength for the fundamental wave frequency. The capacitance of the second capacitor 22 is set within the range from 50 pF to 1000 pF.

Example 2

The RF power amplifier 100 of Example 1 uses the short-stub mode Zin(2f) control circuit (input impedance control circuit) 32 in order to set the input impedance Zin(2f) into a predetermined impedance. On the other hand, an RF power amplifier 200 of Example 2 described below adopts an open-stub mode Zin(2f) control circuit (input impedance control circuit).

Figure 9:
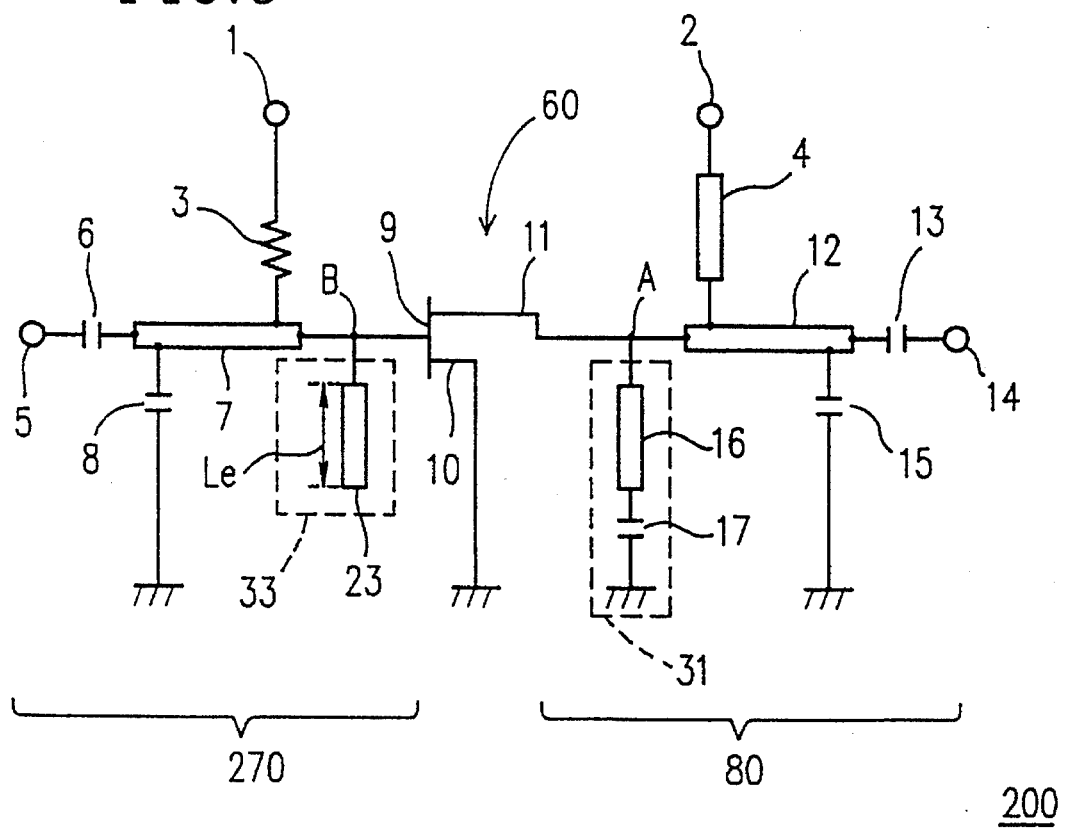
FIG. 9 is a circuit diagram showing the configuration of an RF power amplifier according to Example 2 of the present invention.

FIG. 9 is a circuit diagram showing the RF power amplifier 200 of Example 2. The RF power amplifier 200 includes the FET 60, an impedance matching circuit 270 connected to the input side of the FET 60, and the output impedance matching circuit 80 connected to the output side of the FET 60. The configuration of the RF power amplifier 200 differs from that of the RF power amplifier 100 of Example 1 with respect to the configuration of the input impedance matching circuit 270.

Specifically, a third line 23, having one end left open, is connected to the point B of the RF power amplifier 200, thereby allowing the third line 23 to function as a Zin(2f) control circuit 33. A length Le of the third line 23 is set so that an electric length thereof becomes slightly longer than one-eighth of the wavelength for the fundamental wave frequency. The other circuit configuration is the same as that in the RF power amplifier 100 of Example 1 including the FET 60 to be used. Since the same components as those of the RF power amplifier 100 are denoted by the same reference numerals, the detailed description thereof is herein omitted. The impedances Zin(f), Zout(f) and Zout(2f) are set to the same values as those shown in FIG. 3.

In the same way as that in Example 1, evaluation is carried out at a fundamental wave frequency f=950 MHz. The length Le of the third line 23 is set to be slightly longer than 15 mm at which, on a substrate having a relative dielectric constant $\epsilon_\gamma$ of 10, an electric length thereof is substantially equal to one-eighth of the wavelength for the fundamental wave frequency of 950 MHz. Consequently, the input impedance for the secondary harmonic wave is set to Zin(2f)=0.5+j9Ω.

In such a situation, the operational characteristics of the RF power amplifier 200 demonstrate an output power of 32.5 dBm and a drain efficiency of 75% under the conditions where a fundamental wave frequency is 950 MHz; a drain voltage is 3.5 V; and an input power is 20 dBm. The thus obtained characteristics are the same as those of the amplifier α shown in Table 1.

Next, when the length Le of the third line 23 is varied from 13 mm to 20 mm, the input impedance Zin(2f) for the secondary harmonic wave changes drawing a large arc taking the short-circuit point S on the Smith chart as the center, in the same way as in the case previously shown in FIG. 4. When the input impedance Zin(2f) for the secondary harmonic wave is within the region S shown in Table 1, the characteristics of the RF power amplifier 200 are the same as those of the RF power amplifier β shown in Table 1.

As the result of further detailed examination, the similar operational characteristics to those of the RF power amplifier α, β and γ shown in Table 1 are also obtained in the RF power amplifier 200 of Example 2 when the value of the input impedance Zin(2f) for the secondary harmonic wave is set to each value or within the range shown in Table 1.

As described above, in the RF power amplifier 200 of Example 2, the open-stub mode Zin(2f) control circuit (input impedance control circuit) 33 is connected to the point B instead of the short-stub mode control circuit used in Example 1. The length Le of the third line 23 included in the Zin(2f) control circuit 33 is set so that an electric-length thereof becomes longer than one-eighth of the wavelength for the fundamental wave frequency with respect to the value of the predetermined operational frequency, thereby setting the input impedance Zin(2f) for the secondary harmonic wave in the hatched region previously shown in FIG. 6. In this way, the characteristics similar to those to Example 1 can be obtained.

Specifically, in the case of the fundamental wave frequency f is 950 MHz and a substrate having a relative dielectric constant $\epsilon_\gamma$ of 10 is used, the length Le of the third line 23 is set to be in the range from 15.5 mm to 20 mm which is longer than 15 mm, at which an electric length thereof is equal to one-fourth of the wavelength for the fundamental wave frequency.

Example 3

An RF power amplifier 300 of Example 3 described below adopts an LC series resonance mode Zin(2f) control circuit (input impedance control circuit) in order to set the input impedance Zin(2f) for the secondary harmonic wave within a predetermined range, instead of the short stub mode Zin(2f) control circuit (input impedance control circuit) 32 or the open-stub mode Zin(2f) control circuit (input impedance control circuit) 33.

Figure 10:
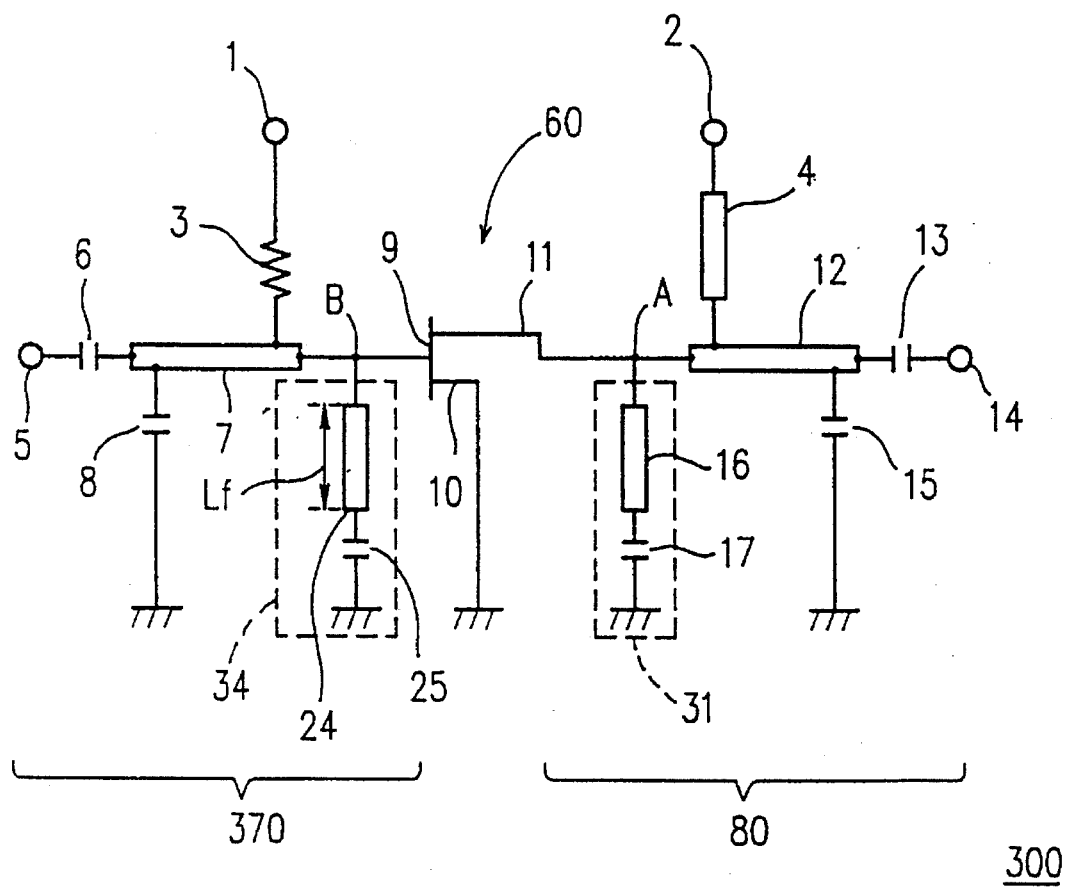
FIG. 10 is a circuit diagram showing the configuration of an RF power amplifier according to Example 3 of the present invention.

FIG. 10 is a circuit diagram showing an RF power amplifier 300 of Example 3. The RF power amplifier 300 includes the FET 60, an impedance matching circuit 370 connected to the input side of the FET 60, and the output impedance matching circuit 80 connected to the output side of the FET 60. The configuration of the RF power amplifier 300 differs from that of the RF power amplifier 100 of Example 1 previously described with reference to FIG. 2 with respect to the configuration of the input impedance matching circuit 370.

Specifically, a fourth line 24 and a fourth capacitor 25 of about 1 to 2 pF having one end grounded are connected to the point B of the RF power amplifier 300. The length Lf of the fourth line 24 is set so that an electric length thereof is about one-sixteenth of the wavelength for the fundamental wave frequency on a substrate having a relative dielectric constant $\epsilon \gamma$ of 10. Consequently, the impedance is almost zero with respect to the secondary harmonic wave when the fourth line 25 is viewed from the point B.

On the other hand, the above capacitance value of the fourth capacitor 25 is smaller than that of the second capacitor 22 included in the Zin(2f) control circuit 32 of Example 1 so as not to be short-circuited for the secondary harmonic wave.

As a result, the circuit 34 including the fourth line 24 and the fourth capacitor 25 is set so as to resonate in series for the secondary harmonic wave. In the RF power amplifier 300, the circuit 34 is made to function as the Zin(2f) control circuit 34.

The other circuit configuration is the same as that of the RF power amplifier 100 of Example 1 including the FET 60 to be used. Since the same components are denoted by the same reference numerals, the detailed description thereof is herein omitted. Each of the impedances Zin(f), Zout(f) and Zout(2f) are set to be the same value as that shown in FIG. 3.

In the same way as that of Example 1, the evaluation is carried out at a fundamental wave frequency f=950 MHz. The length Lf of the fourth line 24 is set to 10 mm, and the capacitance of the fourth capacitor 25 is set to 1.2 pF, thereby obtaining the input impedance Zin(2f)=0.5+j9Ω. A substrate having a relative dielectric constant $\epsilon\gamma$ of 10 is used.

In such a situation, the characteristics of the RF power amplifier 300 demonstrates an output power of 32.5 dBm and a drain efficiency of 75% under the conditions where a fundamental wave frequency is 950 MHz; a drain voltage is 3.5 V; and an input power is 20 dBm. These characteristics are the same as those of the amplifier a shown in Table 1.

Next, while the capacitance of the fourth capacitor 25 is kept constant at 1.2 pF, the length Lf of the fourth line 24 is varied from 7.5 mm to 14.5 mm. Then, the input impedance Zin(2f) for the second harmonic wave varies drawing a large arc, taking the short-circuit point S on the Smith chart as the central point, in substantially the same manner as in the case previously shown in FIG. 4. When the input impedance Zin(2f) for the secondary harmonic wave is within the region S shown in Table 1, the characteristics of the RF power amplifier 300 are the same as those of the harmonic power amplifier β shown in Table 1.

As the result of further detailed examination, the same operational characteristics as those of each of the RF power amplifiers α, β and γ shown in table 1 can also be obtained in the RF power amplifier 300 of Example 3, when a value of the input impedance Zin(2f) for the secondary harmonic wave is set to be each value or within the range shown in Table 1.

As described above, in Example 3, the LC series-resonance mode Zin(2f) control circuit (input impedance control circuit) 34 is connected to the point B. Then, the length Lf of the fourth line 24 and/or the capacitance of the fourth capacitor 25 included in the Zin(2f) control circuit 34 are appropriately set for a predetermined operational frequency. By setting the input impedance Zin(2f) for the secondary harmonic wave so as to be included in the hatched region previously shown in FIG. 6, the same operational performance as that of Example 1 can be obtained.

Specifically, in the case of a fundamental wave frequency f is 950 MHz and a substrate having a relative dielectric constant $\epsilon\gamma$ of 10 is used, it is sufficient to set the length Lf of the fourth line 24 within the range from 10 mm to 13 mm and the capacitance of the fourth capacitor 25 within the range from 1.2 pF to 1.3 pF.

Example 4

An RF power amplifier 400 of Example 4 controls the input impedance Zin(2f) for the secondary harmonic wave while maintaining the input impedance Zin(f) for the fundamental wave constant without using the Zin(2f) control circuit (input impedance control circuit) as used in the previous examples.

Figure 11:
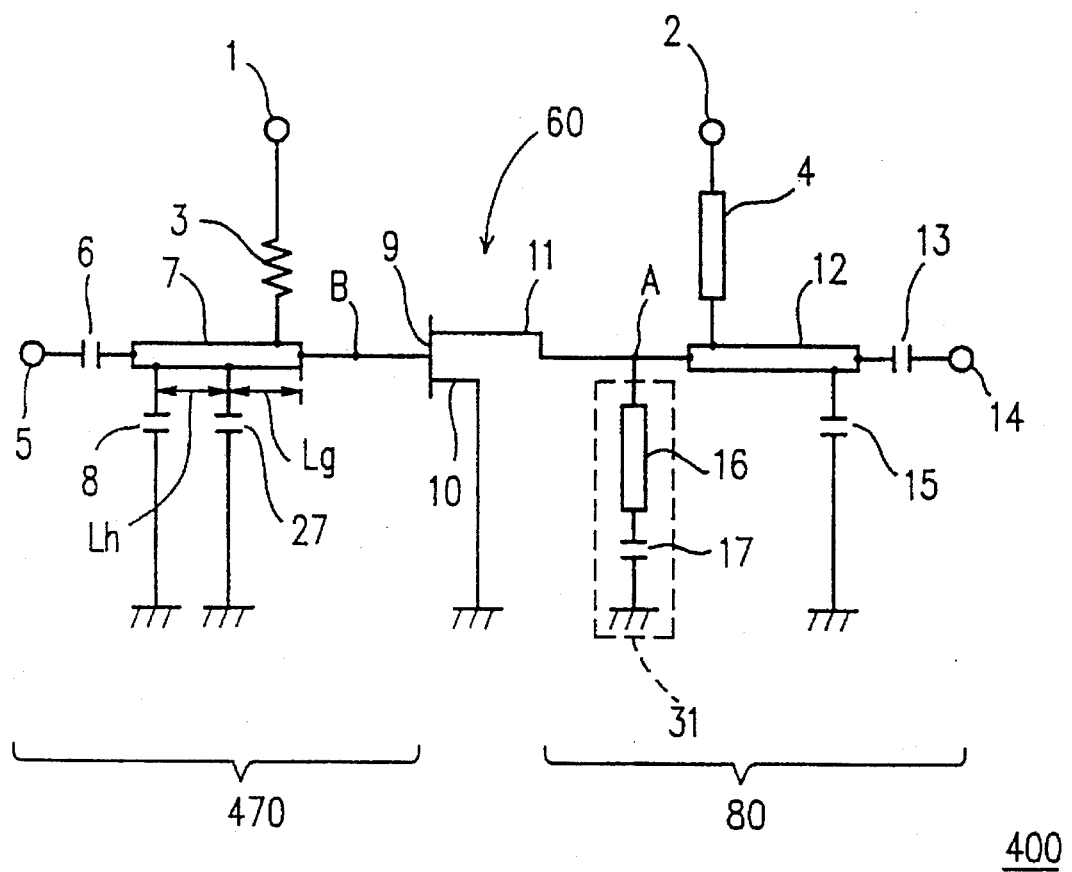
FIG. 11 is a circuit diagram showing the configuration of an RF power amplifier according to Example 4 of the present invention.

FIG. 11 is a circuit diagram showing the RF power amplifier 400 of Example 4. The RF power amplifier 400 includes the FET 60, an input impedance matching circuit 470 connected to the input side of the FET 60, and the output impedance matching circuit 80 connected to the output side of the FET 60. The RF power amplifier 400 differs from the RF power amplifier 100 previously described with reference to FIG. 2 with respect to the configuration of the input impedance matching circuit 470.

More specifically, no Zin(2f) control circuit is connected to the point B of the RF power amplifier 400. On the other hand, a second input-side matching capacitor 27 is connected to the input-side matching line 7 in addition to the input-side matching capacitor 8. The input-side matching capacitors 8 and 27 are connected to the positions Lg+Lh and Lg, respectively, from the end close to the FET 60 of the input-side matching line 7.

The RF power amplifier 400 adjusts the input impedance Zin(2f) for the secondary harmonic wave by appropriately adjusting the capacitance value Cin1 of the input-side matching capacitor 8, a capacitance value Cin2 of the second input-side matching capacitor 27, and the lengths Lg and Lh determining the connected positions of the capacitors 8 and 27.

The other circuit configuration is the same as that of the RF power amplifier 100 of Example 1 including the FET 60 to be used. Since the same components as those of the RF power amplifier 100 are denoted by the same reference numerals, the detailed description thereof is herein omitted. The impedances Zin(f), Zout(f) and Zout(2f) are set to the values shown in FIG. 3, respectively.

In the same way as theft of Example 1, evaluation is carried out at the fundamental wave frequency of f=950 MHz. The values of the above-mentioned parameters are set as follows, respectively: Cin1=6 pF, Cin2=5 pF, Lg=6 mm and Lh=5 mm, so that the input impedance Zin(2f) for the secondary harmonic wave is 0.5+j9Ω when viewed from the point B. A substrate having a relative dielectric constant $\epsilon\gamma$ of 10 is used.

In such a situation, the characteristics of the RF power amplifier 400 demonstrate an output power of 32.5 dBm and a drain efficiency of 75% under the conditions where a fundamental wave frequency is 950 MHz; a drain voltage is 3.5 V; and a input power is 20 dBm. These obtained characteristics are the same as those of the amplifier $\alpha$ shown in Table 1.

As the result of further detailed examination, the same operational characteristics as those of each of the RF power amplifiers $\alpha$, $\beta$ and $\gamma$ shown in Table 1 can also be obtained in the RF power amplifier 400 of Example 4, when a value of the input impedance Zin(2f) for the secondary harmonic wave is set to be each value or within the range shown in Table 1.

As described above, in Example 4, the input impedance Zin(2f) for the secondary harmonic wave is controlled without using the Zin(2f) control circuit. In order to achieve this control, the capacitance values Cin1 and Cin2 for the respective input-side matching capacitors 8 and 27 and the lengths Lg and Lh determining the connected portions of the respective capacitors 8 and 27 to the input-side matching line 7 are appropriately set. In this way, the input impedance Zin(2f) for the secondary harmonic wave is set so as to be included in the hatched region previously shown in FIG. 6, thereby obtaining the same performance as that obtained in Example 1.

Example 5

An RF power amplifier 500 of Example 5 controls the output impedance Zout(2f) for the secondary harmonic wave, while maintaining the output impedance Zout(f) for the fundamental wave at a value which brings the maximum efficiency without using the Zout(2f) control circuit (output impedance control circuit) as used in the previous examples.

Figure 12:
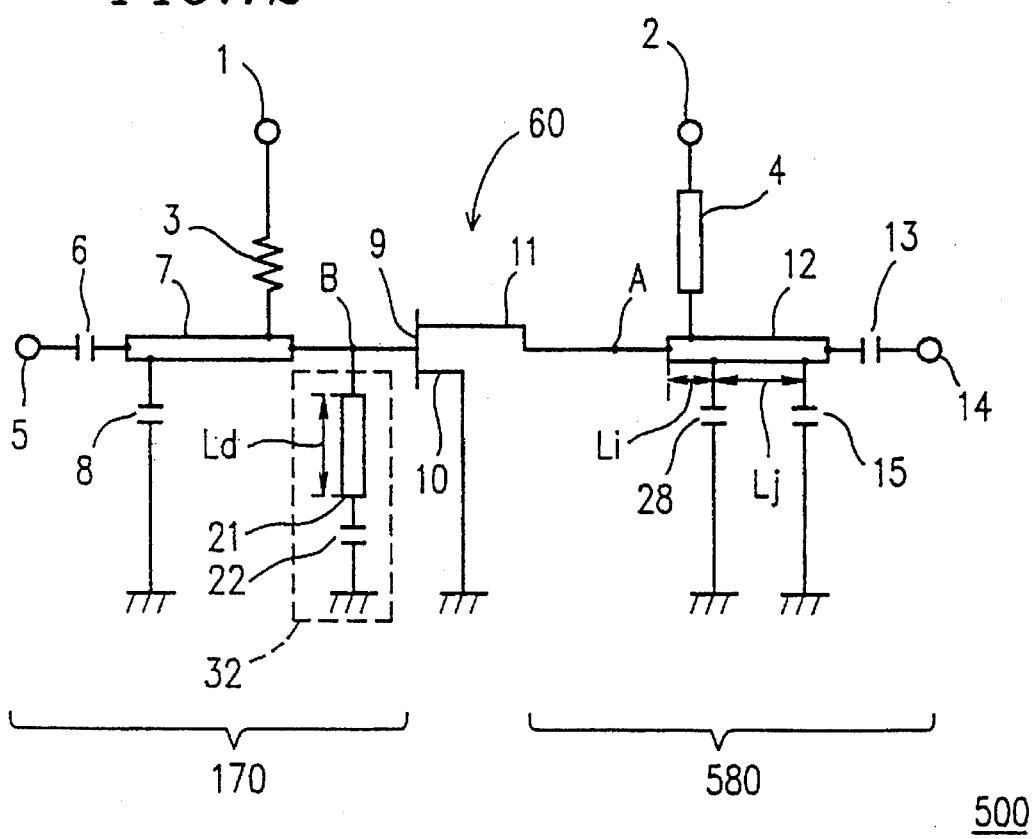
FIG. 12 is a circuit diagram showing the configuration of an RF power amplifier according to Example 5 of the present invention.

FIG. 12 is a circuit diagram showing the RF power amplifier 500 of Example 5. The RF power amplifier 500 includes the FET 60, the input impedance matching circuit 170 connected to the input side of the FET 60, and an output impedance matching circuit 580 connected to the output side of the FET 60.

The RF power amplifier 500 differs from the RF power amplifier 100 previously described with reference to FIG. 2 with respect to the configuration of the output impedance matching circuit 580. On the other hand, the FET 60 and the input impedance matching circuit 170 are the same as those in the RF power amplifier 100 of Example 1. Since the same components are denoted by the same reference numerals, the detailed description thereof is herein omitted.

The short-stub mode Zin(2f) control circuit 32 similar to that in the RF power amplifier 100 (see FIG. 2) of Example 1 is connected to the point B of the RF power amplifier 500. On the other hand, a second output-side matching capacitor 28 is connected to the output-side matching line 12 in addition to the output-side matching capacitor 15. The output-side matching capacitors 15 and 28, as shown in FIG. 12, are connected to the positions Li+Lj and Li, respectively, from the end close to the FET 60 of the output-side matching line 12.

The RF power amplifier 500 adjusts the output impedance Zout(f) for the fundamental wave and the output impedance Zout(2f) for the secondary harmonic wave by appropriately adjusting a capacitance value Cout1 of the output-side matching capacitor 15, a capacitance value Cout2 of the second output-side matching capacitor 28, and the lengths Li and Lj determining the connected positions of the capacitors 15 and 28. Specifically, the values of the respective parameters are set as follows: Cout1=1 pF, Cout2=6 pF, Li=5.5 mm and Lj=2 mm. Consequently, the impedances viewed from the A are set as Zout(f)=6+j1Ω and Zout(2f)=0.5+j13Ω, which give the maximum efficiency with respect to the fundamental wave frequency of 950 MHz. A substrate having a relative dielectric constant $\epsilon\gamma$ of 10 is used herein. These impedances are the same values as those of FIG. 3.

In the same way as that of Example 1, at the fundamental wave frequency of f=950 MHz, the input impedance is adjusted by appropriately setting a length Ld of the first line 21 and a capacitance value of the first capacitor 22 included in the Zin(2f) control circuit 32, thereby obtaining Zin(f)= 4+j12Ω and Zin(2f)=0.5+j9Ω.

In such a situation, the characteristics of the RF power amplifier 500 demonstrate an output power of 32.5 dBm and a drain efficiency of 75% under the conditions where a fundamental wave frequency is 950 MHz; a drain voltage is 3.5 V; a input power is 20 dBm. These obtained characteristics are the same as those of the amplifier α shown in Table 1.

As the result of further detailed examination, the operational characteristics as those of each of the RF power amplifiers α, β and γ shown in Table 1 can also be obtained in the RF power amplifier 500 of Example 5, when a value of the input impedance Zin(2f) for the secondary harmonic wave is set to be each value or within the range shown in Table 1.

As described above, according to Example 5, the input impedance Zin(2f) for the secondary harmonic wave can be set at an optimum value by using the same Zin(2f) control circuit 32 as that of Example 1 without using the Zout(2f) control circuit. Also in this case, the input impedance Zin(2f) for the secondary harmonic wave is set so as to be included in the hatched region previously shown in FIG. 6 by appropriately controlling the length Ld of the second line 21 and/or the capacitance of the second capacitor 22 included in the Zin(2f) control circuit 32. In this way, the same operational performance as that of Example 1 can be obtained.

Example 6

Figure 13:
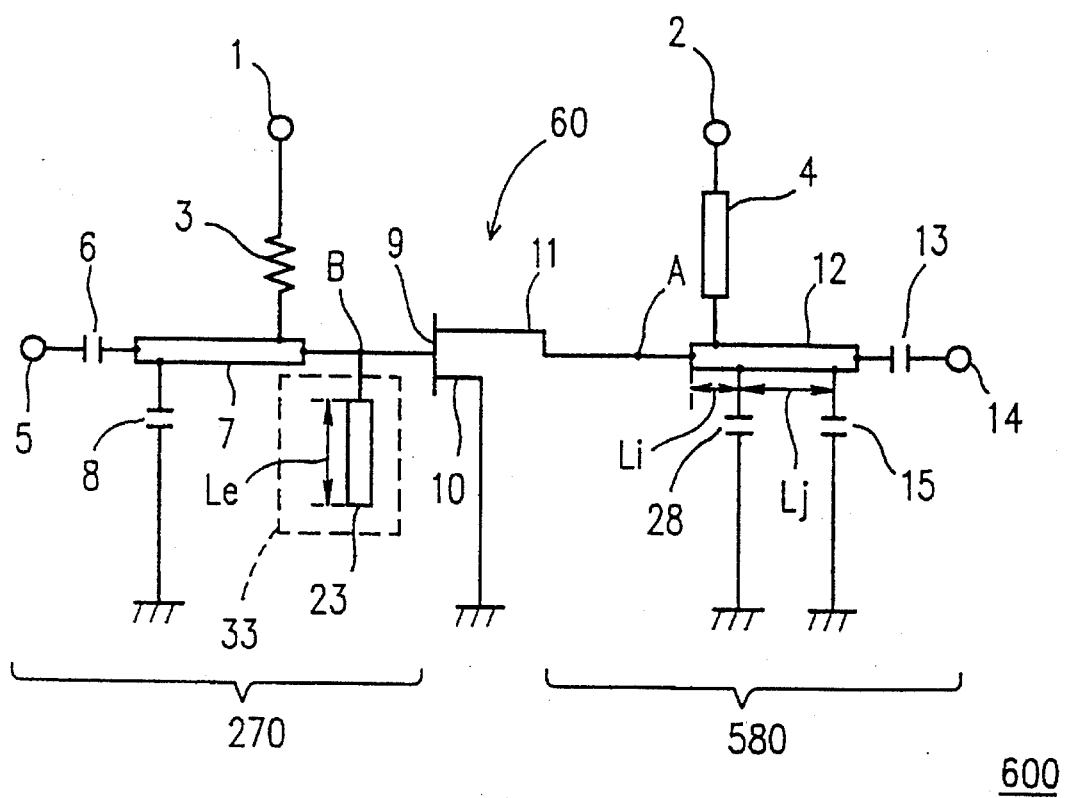
FIG. 13 is a circuit diagram showing the configuration of an RF power amplifier according to Example 6 of the present invention.

FIG. 13 shows a circuit diagram showing an RF power amplifier 600 of Example 6. The RF power amplifier 600 includes the input impedance matching circuit 270 having the same configuration as that of the RF power amplifier 200 in Example 2 and the output impedance matching circuit 580 having the same configuration as that of the RF power amplifier 500 in Example 5.

The RF power amplifier 600 is designed so as to obtain zout(f)=6+j1Ω, Zout(2f)=0.5+j13Ω and Zin(f)=4+j12Ω, with which the operational efficiency becomes maximum at the fundamental wave frequency of 950 MHz. Then, as in Example 2, the Zin(2f) control circuit 33 including the third line 23 is adjusted so as to change the input impedance Zin(2f) for the secondary harmonic wave. As a result, the same operational characteristics as those of the RF power amplifiers α, β and γ shown in Table 1 can also be obtained in the RF power amplifier 600, when a value of the input impedance Zin(2f) for the secondary harmonic wave is set to each value or within the range shown in Table 1.

As described above, the length Le of the third line 23 included in the Zin(2f) control circuit 33 as in Example 2 is set so that an electric length thereof becomes longer than one-eighth of the wavelength for the fundamental wave frequency, whereby the input impedance Zin(2f) for the secondary harmonic wave is set so as to be included in the hatched region previously shown in FIG. 6. In this way, the same performance as that of Example 1 can be obtained.

Example 7

Figure 14:
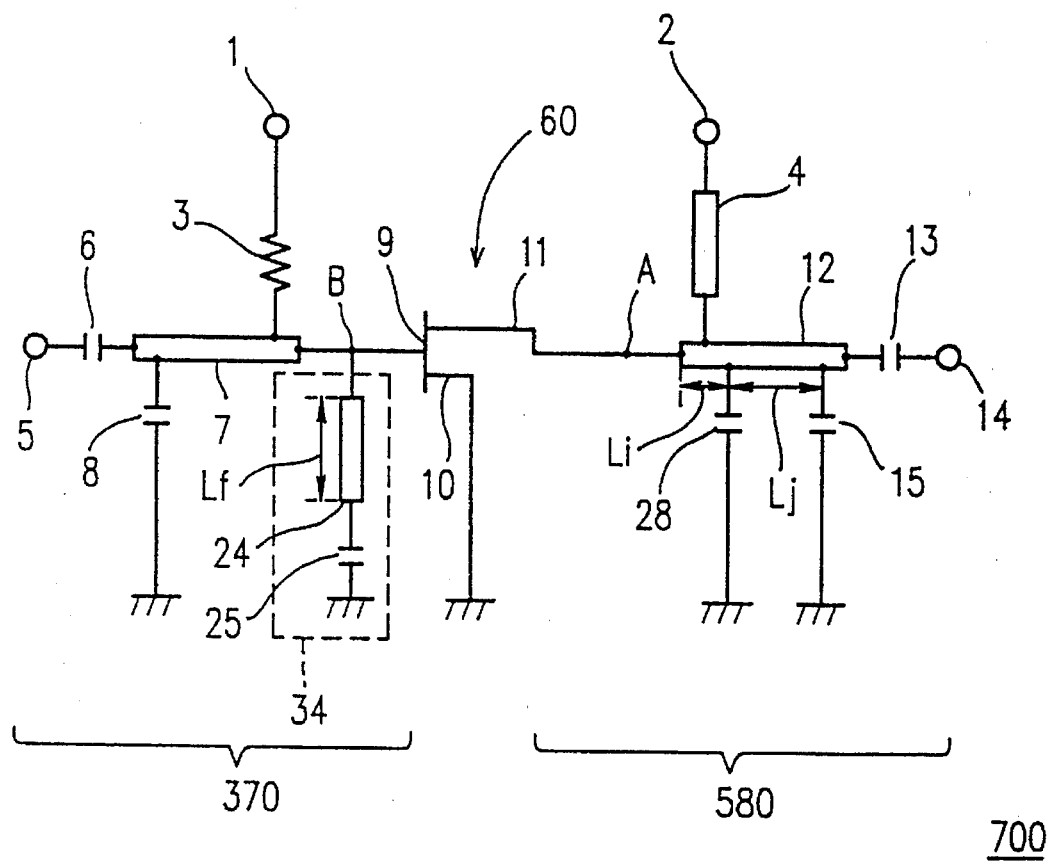
FIG. 14 is a circuit diagram showing the configuration of an RF power amplifier according to Example 7 of the present invention.

FIG. 14 shows a circuit diagram of an RF power amplifier 700 of Example 7. The RF power amplifier 700 includes the input impedance matching circuit 370 having the same configuration as that of the RF power amplifier 300 in Example 3 and the output impedance matching circuit 580 having the same configuration as that of the RF power amplifier 500 in Example 5.

The RF power amplifier 700 is designed so as to obtain Zout(f)=6+j1Ω, Zout(2f)=0.5+j13Ω and Zin(f)=4+j12Ω, with which the operational efficiency becomes maximum at the fundamental wave frequency of 950 MHz. Then, as in Example 3, the length Lf of the fourth line 24 and the capacitance value of the capacitor 25 of the fourth capacitor 25 included in the zin(2f) control circuit are set to the appropriate values so as to change the input impedance Zin(2f) for the secondary harmonic wave. As a result, the same operational characteristics as those of the RF power amplifiers α, β and γ shown in Table 1 can also be obtained in the RF power amplifier 700, when a value of the input impedance Zin(2f) for the secondary harmonic wave is set to each value or within the range shown in Table 1.

As described above, the length Lf of the fourth line 24 and/or the capacitance of the fourth capacitor 25 which are included in the Zin(2f) control circuit 34 as in Example 3 are appropriately set also in the configuration of the RF power amplifier 700 of Example 7. In this way, the input impedance Zin(2f) for the secondary harmonic wave is set so as to be included in the hatched region previously shown in FIG. 6, thereby obtaining the same performance as that of Example 1.

Example 8

Figure 15:
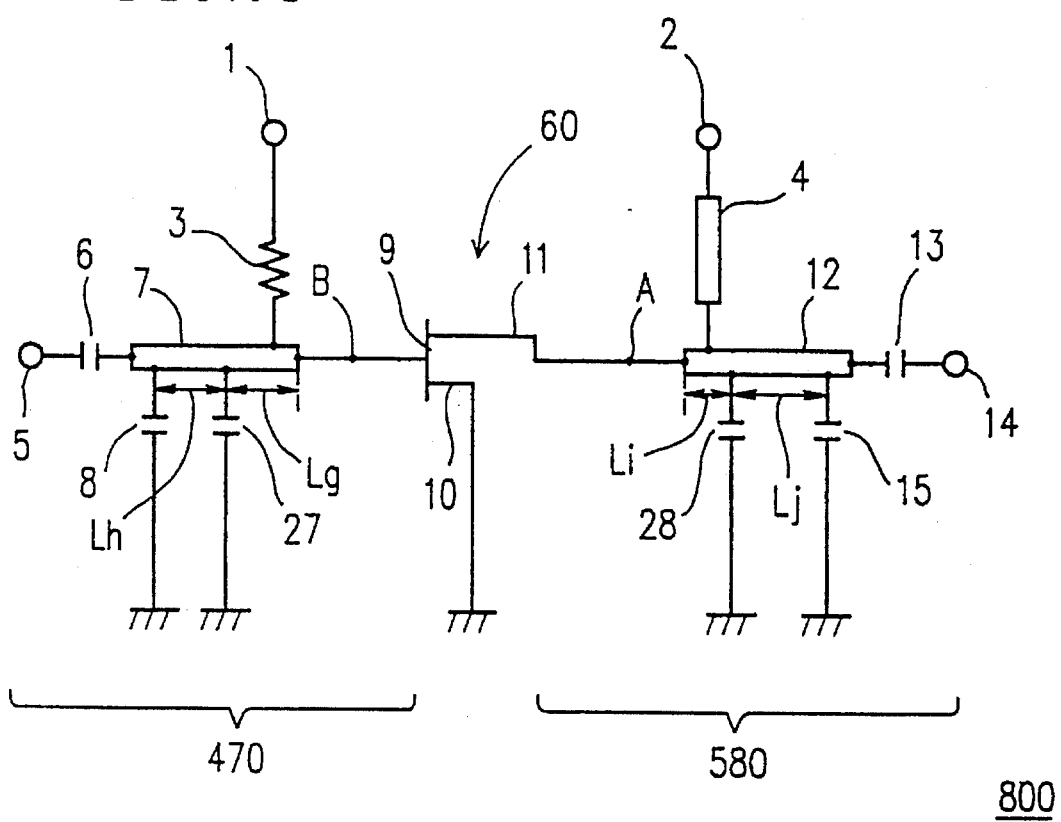
FIG. 15 is a circuit diagram showing the configuration of an RF power amplifier according to Example 8 of the present invention.

FIG. 15 shows a circuit diagram of an RF power amplifier 800 of Example 8. The RF power amplifier 800 includes the input impedance matching circuit 470 as that of the RF power amplifier 400 in Example 4 and the output impedance matching circuit 550 as that of the RF power amplifier 580 as that of the RF power amplifier 500 in Example 5.

The RF power amplifier 800 is designed so as to obtain Zout(f)=6+j1Ω, Zout(2f)=0.5+j13Ω and Zin(f)=4+j12Ω, with which the operational efficiency becomes maximum at the fundamental wave frequency of 950 MHz. Then, as in Example 4, the capacitance value Cin1 of the input-side matching capacitor 8, the capacitance value Cin2 of the second input-side matching capacitor 27 and the lengths Lg and Lh indicating the connection portions thereof are adjusted to change the input impedance Zin(2f) for the secondary harmonic wave. As a result, the same operational characteristics as those of the RF power amplifiers α, β and γ shown in Table 1 can also be obtained in the RF power amplifier 800, when the value of the input impedance Zin(2f) for the secondary harmonic wave is set to each value or within the range shown in Table 1.

As described above, also in the configuration of the RF power amplifier 800 of Example 8, the input impedance Zin(2f) for the secondary harmonic wave is controlled without using the Zin(2f) control circuit as in the Example 4. For that purpose, the capacitance values Cin1 and Cin2 of the respective input-side matching capacitors 8 and 27 and the lengths Lg and Lh determining the connection portions to the input-side matching line 7 are appropriately set. In this way, the input impedance Zin(2f) for the secondary harmonic wave is set so as to be included in the hatched region previously shown in FIG. 6, thereby obtaining the same performance as that in Example 1.

The region of the input impedance Zin(2f) for the secondary harmonic wave where the drain efficiency becomes higher as compared with that of the conventional RF power amplifier is enclosed by the point A (0+j4Ω), the point B (0+j25Ω), the point C (5+j25Ω) and the point D (5+j4Ω) as shown in FIG. 6.

As described above, according to the present invention, the input impedance for the secondary harmonic wave is set within the predetermined range, thereby realizing the RF power amplifier with a higher operational efficiency than that of the conventional one.

In the RF power amplifier of the present invention, the input impedance matching circuit is provided with the input impedance control circuit for controlling the input impedance for the harmonic wave with respect to the fundamental wave frequency. By this control, a sinusoidal voltage waveform at the gate end of the power transistor included in the RF power amplifier is changed into a voltage waveform close to a trapezoidal form.

By making the gate voltage waveform approach the trapezoidal waveform, switching of voltage/current at the drain end is accelerated so as to shorten the time period in which the current and the voltage simultaneously occur at the drain end. As a result, power consumption in the form of heat inside the power transistor is reduced, resulting in an improvement of the conversion efficiency into radio-frequency (RF) power. As a result, the operational efficiency of the RF power amplifier is rapidly improved.

More specifically, using a GaAs FET, the performances which far exceed those of a conventional RF power amplifier, for example, an output power of 32.5 dBm and a drain efficiency of 75%, are achieved at a lower voltage operation, i.e., a drain voltage of 3.5 V. This corresponds to an improvement of 10% at most in terms of a drain efficiency as compared with that of the conventional RF power amplifier.

The input impedance control circuit is configured so as to have a resonance point for the harmonic wave of a lower frequency than the operational frequency band of the power transistor.

Alternatively, the input impedance control circuit sets the input impedance for the secondary harmonic wave within the aforementioned range. By this setting, a phase angle of the input impedance for the secondary harmonic wave is controlled so as to be within the range of 130° to 170°, thereby setting the input impedance for the secondary harmonic wave within the inductive region.

On the other hand, in the RF power amplifier defined of the present invention, the input impedance matching circuit can be appropriately configured even without using the input impedance control circuit as described above, thereby still obtaining the above-described same advantages.

In such a case, the input impedance matching circuit sets the input impedance for the secondary harmonic wave within the aforementioned range. As a result, the phase angle of the input impedance for the secondary harmonic wave is controlled to be within the range of 130° to 170°, thereby setting the input impedance for the secondary harmonic wave in the inductive region.

The input impedance matching circuit having the above-mentioned function is configured, for example, so as to include a matching line connected to the input of the power transistor, a first matching capacitor which is connected to a first predetermined position of the matching line and grounded, and a second matching capacitor which is connected to a second predetermined position of the matching line and grounded. Then, the capacitance values of the first and the second matching capacitors and the first and the second predetermined positions are controlled so as to set the input impedance for the secondary harmonic wave within a predetermined range.

The output impedance control circuit included in the RF power amplifier controls the output impedance for the secondary harmonic wave so as to set the output impedance to a predetermined value. With this setting, the output impedance matching with higher efficiency is achieved, resulting in further improvement of the operational efficiency of the RF power amplifier.

Alternatively, the output impedance control circuit is configured so that output impedance for the secondary harmonic wave is set to a value with which the maximum operational efficiency of the power transistor is yielded. With this configuration, the operational efficiency of the RF power amplifier is improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A radio-frequency power amplifier comprising:

a power transistor;

an input impedance matching circuit connected to an input of the power transistor; and an output impedance matching circuit connected to an output of the power transistor, wherein the input impedance matching circuit includes an input impedance control circuit for setting an input impedance for a harmonic wave with respect to a fundamental wave frequency within a predetermined non-zero impedance range, the input impedance control circuit being connected to the input of the power transistor.

2. A radio-frequency power amplifier comprising:

a power transistor;

an input impedance matching circuit connected to an input of the power transistor; and an output impedance matching circuit connected to an output of the power transistor, wherein the input impedance matching circuit includes an input impedance control circuit for setting an input impedance for a harmonic wave with respect to a fundamental wave frequency within a predetermined range, the input impedance control circuit being connected to the input of the power transistor, and wherein the input impedance control circuit has a resonance point for a harmonic wave of a lower frequency than an operational frequency band of the power transistor.

3. A radio-frequency power amplifier according to claim 1, wherein the input impedance control circuit sets an input impedance for a secondary harmonic wave within a range enclosed by a point A (0+j4Ω), a point B (0+j25Ω), a point C (5+j25Ω) and a point D (5+j4Ω) on a Smith chart.

4. A radio-frequency power amplifier according to claim 1, wherein the input impedance control circuit includes:

a line having an electric length longer than one-fourth of a wavelength for the fundamental wave frequency; and a capacitor having one end connected to the line in series and another end grounded.

5. A radio-frequency power amplifier according to claim 1, wherein the input impedance control circuit includes a line having an electric length longer than one-eighth of a wavelength for the fundamental wave frequency, the line having an open end.

6. A radio-frequency power amplifier according to claim 1, wherein the input impedance control circuit includes a series resonance circuit, the series resonance circuit including a line and a capacitor, the capacitor having one end connected to the line in series and another end grounded.

7. A radio-frequency power amplifier according to claim 1, wherein the output impedance matching circuit includes an output impedance control circuit for setting an output impedance for the harmonic wave to a predetermined value, the output impedance control circuit being connected to the output of the power transistor.

8. A radio-frequency power amplifier according to claim 1, wherein the output impedance matching circuit is configured so that an output impedance for a secondary harmonic wave is set to a value with which a maximum operational efficiency of the power transistor is yielded.

9. A radio-frequency power amplifier comprising:
   a power transistor;
   an input impedance matching circuit connected to an input of the power transistor; and
   an output impedance matching circuit connected to an output of the power transistor,
   wherein the input impedance matching circuit sets an input impedance for a harmonic wave with respect to a fundamental wave frequency within a predetermined non-zero impedance range.

10. A radio-frequency power amplifier according to claim 9, wherein the input impedance matching circuit sets an input impedance for a secondary harmonic wave within a range enclosed by a point A (0+j4Ω), a point B (0+j25Ω), a point C (5+j25Ω) and a point D (5+j4Ω) on a Smith chart.

11. A radio-frequency power amplifier comprising:
    a power transistor;
    an input impedance matching circuit connected to an input of the power transistor; and
    an output impedance matching circuit connected to an output of the power transistor,
    wherein the input impedance matching circuit sets an input impedance for a harmonic wave with respect to a fundamental wave frequency within a predetermined range, and wherein the input impedance matching circuit includes:
    a matching line connected to the input of the power transistor;
    a first matching capacitor having one end connected to a first predetermined position of the matching line and another end grounded; and
    a second matching capacitor having one end connected to a second predetermined position of the matching line and another end grounded,
    and wherein a capacitance value of the first matching capacitor, a capacitance value of the second matching capacitor, and the first and the second predetermined positions are respectively selected so that an input impedance for a secondary harmonic wave is set within a predetermined range.

12. A radio-frequency power amplifier according to claim 9, wherein the output impedance matching circuit includes an output impedance control circuit which is connected to the output of the power transistor and sets an output impedance for the harmonic wave to a predetermined value.

13. A radio-frequency power amplifier according to claim 9, wherein the output impedance matching circuit is configured so that an output impedance for a secondary harmonic wave is set to a value with which a maximum operational efficiency of the power transistor is yielded.

* * * * *